(12) United States Patent
Nyberg et al.

(10) Patent No.: US 11,897,113 B2
(45) Date of Patent: Feb. 13, 2024

(54) HAND HELD POWER TOOL WITH A HUMAN MACHINE INTERFACE

(71) Applicant: HUSQVARNA AB, Huskvarna (SE)

(72) Inventors: Tobias Nyberg, Huskvarna (SE); Christian Bylund, Huskvarna (SE); Henric Isén, Huskvarna (SE); Martin Larsén, Jönköping (SE); Pär-Ola Svensson, Forserum (SE); Stefan Stark, Huskvarna (SE)

(73) Assignee: HUSQVARNA AB, Huskvarna (SE)

( * ) Notice: Subject to any disclaimer, the term of this patent is extended or adjusted under 35 U.S.C. 154(b) by 123 days.

(21) Appl. No.: 17/252,039

(22) PCT Filed: Jun. 25, 2019

(86) PCT No.: PCT/SE2019/050613
§ 371 (c)(1),
(2) Date: Dec. 14, 2020

(87) PCT Pub. No.: WO2020/013747
PCT Pub. Date: Jan. 16, 2020

(65) Prior Publication Data
US 2021/0252688 A1 Aug. 19, 2021

(30) Foreign Application Priority Data
Jul. 11, 2018 (SE) .................... 1850881-2

(51) Int. Cl.
B25F 5/02 (2006.01)
A01G 20/47 (2018.01)
(Continued)

(52) U.S. Cl.
CPC .............. B25F 5/02 (2013.01); A01D 34/416 (2013.01); A01G 3/053 (2013.01); A01G 20/47 (2018.02);
(Continued)

(58) Field of Classification Search
CPC .......................... G06K 7/10405; B60Q 1/0029
See application file for complete search history.

(56) References Cited

U.S. PATENT DOCUMENTS 5,747,953 A * 5/1998 Philipp ................. H02P 25/032
388/907
6,443,675 B1 * 9/2002 Kopras ..................... B25F 5/02
409/137
(Continued)

FOREIGN PATENT DOCUMENTS

CN 201523570 U 7/2010
CN 102131382 A 7/2011
(Continued)

OTHER PUBLICATIONS

International Search Report and Written Opinion for International Application No. PCT/SE2019/050613 dated Sep. 9, 2019.
(Continued)

Primary Examiner — Joshua G Kotis
(74) Attorney, Agent, or Firm — BURR & FORMAN LLP

(57) ABSTRACT

A power tool (1) is disclosed comprising a tool (3), a power source (5) arranged to power the tool (3), a throttle lever (7), a circuit board (9), and a human machine interface (10) comprising components (15, 17, 19) arranged on the circuit board (9). The power tool (1) further comprises a magnet (11) operably connected to the throttle lever (7), and a sensor arrangement (13) configured to sense the intensity of the magnetic field of the magnet (11). The sensor arrangement (13) is arranged on the circuit board (9).

19 Claims, 5 Drawing Sheets

(51) Int. Cl.
  *A01D 34/416* (2006.01)
  *A01G 3/053* (2006.01)
  *B23D 45/16* (2006.01)
  *B23D 57/02* (2006.01)
  *B25F 3/00* (2006.01)

(52) U.S. Cl.
  CPC ............ *B23D 45/16* (2013.01); *B23D 57/023* (2013.01); *B25F 3/00* (2013.01)

(56) References Cited

U.S. PATENT DOCUMENTS

| | | | | |
|---|---|---|---|---|
| 6,960,894 | B2* | 11/2005 | Carusillo | A61B 17/142 |
| | | | | 318/434 |
| 10,207,380 | B2* | 2/2019 | Billings | B25F 5/00 |
| 11,400,570 | B2* | 8/2022 | Thorson | B25B 21/00 |
| 2009/0229842 | A1 | 9/2009 | Gray et al. | |
| 2011/0278035 | A1 | 11/2011 | Chen | |
| 2012/0011729 | A1 | 1/2012 | Kim et al. | |
| 2012/0102755 | A1* | 5/2012 | Racov | A01D 34/4167 |
| | | | | 30/142 |
| 2013/0027028 | A1* | 1/2013 | Hohe | G01D 5/145 |
| | | | | 324/207.11 |
| 2014/0008090 | A1* | 1/2014 | Kokinelis | B25F 5/02 |
| | | | | 29/428 |
| 2014/0015383 | A1 | 1/2014 | Kokinelis et al. | |
| 2014/0296860 | A1* | 10/2014 | Stein | A61B 34/20 |
| | | | | 606/90 |
| 2015/0042280 | A1* | 2/2015 | Rief | H02J 7/0044 |
| | | | | 320/113 |
| 2015/0113811 | A1* | 4/2015 | Bieler | B26B 13/00 |
| | | | | 30/228 |
| 2015/0231778 | A1* | 8/2015 | Borst | B25F 5/02 |
| | | | | 173/1 |
| 2017/0191851 | A1* | 7/2017 | Hill | G01D 5/145 |
| 2017/0207467 | A1* | 7/2017 | Shelton, IV | H01M 10/48 |
| 2018/0215029 | A1* | 8/2018 | Steckel | B25B 21/00 |
| 2018/0293881 | A1* | 10/2018 | Leason | B63B 32/10 |
| 2020/0235638 | A1* | 7/2020 | Velderman | B25F 5/00 |

FOREIGN PATENT DOCUMENTS

| | | | | |
|---|---|---|---|---|
| CN | 102132133 A1 | 7/2011 | | |
| CN | 103534067 A | 1/2014 | | |
| CN | 104519166 A | 4/2015 | | |
| CN | 105044630 A | 11/2015 | | |
| CN | 107110918 A | 8/2017 | | |
| CN | 108015725 A | 5/2018 | | |
| CN | 108015725 A * | 5/2018 | ............ | A01D 34/67 |
| EP | 1369206 A1 | 12/2003 | | |
| EP | 2163853 A1 | 3/2010 | | |
| EP | 2688080 A2 | 1/2014 | | |
| EP | 3155996 A1 * | 4/2017 | ....... | A61B 17/32002 |
| JP | 3188638 U | 1/2014 | | |
| WO | WO-2007002180 A2 * | 1/2007 | ............ | A61B 17/15 |
| WO | 2012134471 A1 | 10/2012 | | |
| WO | 2012134473 A1 | 10/2012 | | |
| WO | WO-2012134469 A1 * | 10/2012 | ............... | B25F 5/00 |
| WO | WO-2017103853 A1 * | 6/2017 | ............. | G01D 5/14 |
| WO | WO-2019238388 A1 * | 12/2019 | ............. | B25F 5/001 |

OTHER PUBLICATIONS

Swedish Office Action and Search Report for Swedish Application No. 1850881-2, dated Feb. 15, 2019.

* cited by examiner

HAND HELD POWER TOOL WITH A HUMAN MACHINE INTERFACE

TECHNICAL FIELD

The present disclosure relates to a power tool comprising a circuit board.

BACKGROUND

Today, there are many kinds of power tools available on the market. Examples are chain saws, circular saws, trimmers, hedge trimmers, lawn mowers, leaf blowers, multitools, snow blowers, and the like. Power tools are for example used in industry, in construction, in gardens, for housework tasks, and around houses for purposes of driving fasteners, drilling, cutting, shaping, sanding, grinding, routing, polishing, painting, heating, and the like.

A common feature of power tools is that they comprise a tool which can be driven by a power source other than solely manual labour. The power source may for example comprise an electric motor, a pneumatic motor, a combustion engine, or the like. Usually, a power tool comprises a throttle lever allowing a user to control the power outputted by the power source. Many solutions utilize a potentiometer for indicating the position of the throttle lever. However, such solutions are associated with some problems and drawbacks. Examples are durability and reliability.

Modern power tools can be provided with different features and functions which can facilitate the use of the power tool and/or can improve the result of a use session of the power tool. However, many of these features and functions add cost and complexity to the power tool. As an example, the addition of one or more features and functions usually require the addition of several electrical components and electrical connections, such as electrical cables.

There are several more problems that may be addressed when designing a power tool. As indicated above, one problem is reliability. That is, power tools usually operate in a demanding environment with a lot of dust, debris, water, vibrations, and the like. Therefore, when designing a power tool, it is preferably ensured that it is durable and reliable. The addition of one or more features and functions may impair the durability and reliability of a power tool. A further problem that may be addressed is user-friendliness. For example, it is an advantage if the power tool is designed such that a user can operate the power tool in an ergonomic and intuitive manner.

Furthermore, generally, on today's consumer market, it is an advantage if products, such as power tools, have conditions and/or characteristics suitable for being manufactured and assembled in a cost-efficient manner.

SUMMARY

It is an object of the present invention to overcome, or at least alleviate, at least some of the above-mentioned problems and drawbacks.

According to a first aspect of the invention, the object is achieved by a power tool comprising a tool, a power source arranged to power the tool, a throttle lever, a circuit board, and a human machine interface comprising components arranged on the circuit board. The power tool further comprises a magnet operably connected to the throttle lever and a sensor arrangement configured to sense the intensity of the magnetic field of the magnet. The sensor arrangement is arranged on the circuit board.

Since the power tool comprises a magnet operably connected to the throttle lever and a sensor arrangement configured to sense the intensity of the magnetic field of the magnet, an accurate, robust, and durable sensing of the position of the throttle lever is provided. Furthermore, since the power tool comprises a human machine interface comprising components arranged on the circuit board, and since the sensor arrangement is arranged on the circuit board, a power tool is provided having conditions for several features and functions without significantly adding cost and complexity to the power tool. Furthermore, due to these features, a power tool is provided having conditions and characteristics suitable for being manufactured and assembled in a cost-efficient manner.

Moreover, because the position of the throttle lever is sensed by sensing the intensity of the magnetic field of the magnet, i.e. in a contact-less manner, conditions are provided for obtaining a dust/debris/water resistant power tool, simply by arranging the circuit board in a dust/debris/water resistant casing.

Accordingly, a power tool is provided overcoming, or at least alleviating, at least some of the above-mentioned problems and drawbacks. As a result, the above-mentioned object is achieved.

Optionally, the components of the human machine interface are arranged on a first side of the circuit board, and wherein the magnet is arranged at a distance from the circuit board on a second side of the circuit board. Thereby, a power tool is provided in which the space available in the power tool is utilized in an efficient manner. This because, in most cases, the human machine interface is arranged on a side of the power tool facing the user during operation of the power tool and the throttle is arranged on a side of the power tool facing away from the user during operation of the power tool. Thus, by arranging the components of the human machine interface on a first side of the circuit board, and the magnet at a distance from the circuit board on a second side of the circuit board, the space available in the power tool is utilized in an efficient manner.

Optionally, the sensor arrangement is arranged on the second side of the circuit board. Thereby, a power tool is provided in which the position of the throttle lever is sensed with improved accuracy. Furthermore, a power tool is provided in which the space available on the circuit board is utilized in an efficient manner.

Optionally, the sensor arrangement is configured to sense the intensity of the magnetic field of the magnet along a first sensing direction and along a second sensing direction, and wherein the second sensing direction is different from the first sensing direction. Thereby, a power tool is provided in which the position of the throttle lever is sensed with improved accuracy and in a manner more resistant to external disturbances. This because by sensing the magnetic field of the magnet in two different sensing directions, the combined sensing will indicate the angle of the magnetic field instead of solely the field strength of the magnetic field. The angle of the magnetic field varies less and is less sensitive to external disturbances, than the field strength of the magnetic field. Thus, by sensing the magnetic field of the magnet in two different sensing directions, the position of the throttle lever is sensed with improved accuracy and in a manner more resistant to external disturbances.

Optionally, the first sensing direction extends in a direction substantially coinciding with a direction of a travel path of the magnet. Thereby, an efficient and reliable sensing of the position of the throttle lever is provided.

Optionally, the circuit board extends in a second plane, and wherein the second sensing direction extends through the second plane. Thereby, an efficient and reliable sensing of the position of the throttle lever is provided.

Optionally, the components of the human machine interface comprise one or more buttons. Thereby, a power tool is provided having conditions for several features and functions without significantly adding cost and complexity to the power tool. This because the circuit board comprises components of one or more buttons as well as the sensor arrangement configured to sense the intensity of the magnetic field of the magnet.

Optionally, the components of the human machine interface comprise a key pad. Thereby, a power tool is provided having conditions for several features and functions without significantly adding cost and complexity to the power tool. This because the circuit board comprises components of the key pad as well as the sensor arrangement configured to sense the intensity of the magnetic field of the magnet.

Optionally, the components of the human machine interface comprise a display. Thereby, a power tool is provided having conditions for several features and functions without significantly adding cost and complexity to the power tool. This because the circuit board comprises components of the display as well as the sensor arrangement configured to sense the intensity of the magnetic field of the magnet.

Optionally, the throttle lever is displaceable between an unactuated position and an actuated position, and wherein the power tool comprises a mechanical switch configured to generate a signal when the throttle lever is displaced from the unactuated position. Thereby, a robust and reliable sensing is provided of displacement of the throttle lever from the unactuated position.

Optionally, the throttle lever is displaceable between an unactuated position and an actuated position, and wherein the magnet and the sensor arrangement are arranged such that the magnetic field of the magnet, at the position of the sensor arrangement and in at least one sensing direction of the sensor arrangement, changes polarity upon a displacement of the throttle lever from the unactuated position towards the actuated position. Thereby, an even more accurate, robust, and reliable sensing of the position of the throttle lever is provided. This because the change in polarity of the magnetic field of the magnet can be sensed in a more accurate manner than a change in strength of the magnetic field.

Optionally, the actuated position is a fully actuated position, and wherein the magnet and the sensor arrangement are arranged such that the magnetic field of the magnet, at the position of the sensor arrangement and in at least one sensing direction of the sensor arrangement, changes polarity when the throttle lever is displaced a distance within the range of 5%-20% of a full travel length of the throttle lever between the unactuated position and the actuated position. Thereby, an even more accurate, robust, and reliable sensing of a displacement of the throttle lever from the unactuated position is provided. This because the change in polarity of the magnetic field of the magnet can be sensed in a more accurate manner than a change in strength of the magnetic field. As a further result of these features, a safer power tool can be provided.

Optionally, the magnet is movably arranged in a moving direction between a first and a second end point, and wherein the length of the magnet, in the moving direction, is within the range of 50%-300%, such as within the range of 100%-200%, of a moving distance of the magnet between the first and second end points. Thereby, an even more accurate, robust, and reliable sensing of the position of the throttle lever is provided.

Optionally, the circuit board extends in a second plane and the magnet is movably arranged in a third plane, and wherein the third plane is substantially parallel to the second plane. Thereby, an even more accurate, robust, and reliable sensing of the position of the throttle lever is provided, while the space available in the power tool is utilized in an efficient manner.

Optionally, the magnet is movably arranged along an arc. Thereby, an accurate, robust, and reliable sensing of the position of the throttle lever is provided, while conditions are provided for manufacturing and assembling the power tool in a cost-efficient manner.

Optionally, the magnet is rotatably arranged. Thereby, an accurate, robust, and reliable sensing of the position of the throttle lever is provided, while conditions are provided for manufacturing and assembling the power tool in a cost-efficient manner.

Optionally, the magnet is shaped as a wheel. Thereby, an accurate, robust, and reliable sensing of the position of the throttle lever is provided, while conditions are provided for manufacturing and assembling the power tool in a cost-efficient manner.

Optionally, the magnet is movably arranged between a first and a second end point, and wherein the power tool comprises a spring arranged to bias the magnet towards the first endpoint. Thereby, a simple and safe power tool is provided having conditions and characteristics suitable for being manufactured and assembled in a cost-efficient manner Optionally, the power tool comprises a sealed enclosure, and wherein the circuit board is arranged in the sealed enclosure. Thereby, a power tool is provided being more resistant to dust, debris, and/or water, in a simple and cost-efficient manner.

Optionally, the magnet is arranged outside of the sealed enclosure. Since the magnet is arranged outside of the sealed enclosure, there is no need for mechanical linkages, or the like, extending through the sealed enclosure. Thus, a power tool is provided being more resistant to dust, debris, and/or water, in a simple and cost-efficient manner.

Optionally, the sensor arrangement comprises at least two sensors, each configured to sense the intensity of the magnetic field of the magnet. Thereby, an even more accurate and robust sensing of the position of the throttle lever is provided. Furthermore, a sensor arrangement is provided being more resistant to external disturbances.

Optionally, the magnet is movably arranged along a travel path, and wherein the at least two sensors, are arranged in a first plane substantially perpendicular to the travel path. Thereby, an even more accurate and robust sensing of the position of the throttle lever is provided. Furthermore, a sensor arrangement is provided being more resistant to external disturbances.

Optionally, the angle between two sensors of the at least two sensors, measured in the first plane at a point coinciding with the travel path of the magnet, is approximately 90 degrees or approximately 180 degrees. Thereby, an even more accurate and robust sensing of the position of the throttle lever is provided. Furthermore, a sensor arrangement is provided being more resistant to external disturbances.

Optionally, the sensor arrangement comprises three sensors, and wherein the angle between two adjacent sensors of the three sensors, measured in the first plane at a point coinciding with the travel path of the magnet, is approximately 90 degrees or approximately 120 degrees. Thereby, an even more accurate and robust sensing of the position of the throttle lever is provided. Furthermore, a sensor arrangement is provided being more resistant to external disturbances.

Optionally, the human machine interface and the throttle lever are positioned at positions of the power tool allowing a user to operate the human machine interface and the throttle lever simultaneously using one hand only. Thereby, an ergonomic and user-friendly power tool is provided in a cost-efficient manner. Furthermore, a power tool is provided having conditions and characteristics for being used in an intuitive manner.

Optionally, the power tool comprises a control unit configured to monitor the position of the throttle lever based on data from the sensor arrangement. Thereby, an accurate, robust, and reliable monitoring of the position of the throttle lever is provided, while conditions are provided for manufacturing and assembling the power tool in a cost-efficient manner.

Optionally, the control unit is arranged on the circuit board. Thereby, an accurate, robust, and reliable monitoring of the position of the throttle lever is provided, while conditions are provided for manufacturing and assembling the power tool in a cost-efficient manner.

Optionally, the sensor arrangement comprises at least two sensors, and wherein the control unit is configured to detect a displacement of the throttle lever from an unactuated position using data from the at least two sensors. Thereby, an even more accurate, robust, and reliable sensing is provided of a displacement of the throttle lever from the unactuated position. As a further result, a safer power tool can be provided in a cost-efficient manner.

Optionally, the power tool comprises a power source controller, wherein the control unit is operably connected to the power source controller, and wherein the power source controller is configured to control the power of the power source in dependence of the monitored position of the throttle lever. Thereby, an accurate, robust, and reliable control of power of the power source is provided, while conditions are provided for manufacturing and assembling the power tool in a cost-efficient manner.

Optionally, the power tool comprises an electronic communication bus, wherein the control unit is operably connected to the power source controller via the electronic communication bus. Thereby, an accurate, robust, and reliable control of power of the power source is provided, while conditions are provided for manufacturing and assembling the power tool in an even further cost-efficient manner. This because the electronic communication bus reduces the number of electrical connections needed in the power tool. Moreover, a power tool is provided having conditions for the addition of several features and functions without significantly adding cost and complexity to the power tool.

Optionally, the control unit comprises a microprocessor. Thereby, an accurate, robust, and reliable sensing of the position of the throttle lever is provided, while conditions are provided for manufacturing and assembling the power tool in a cost-efficient manner. Moreover, a power tool is provided having conditions for the addition of several features and functions without significantly adding cost and complexity to the power tool.

Optionally, the microprocessor is operably connected to the human machine interface. Thereby, a power tool is provided having conditions for several features and functions without significantly adding cost and complexity to the power tool.

Optionally, the circuit board comprises an electronic communication bus configured to transfer data between the sensor arrangement and the microprocessor. Thereby, an accurate, robust, and reliable sensing of the position of the throttle lever is provided, while conditions are provided for manufacturing and assembling the power tool in a cost-efficient manner. This because the electronic communication bus reduces the number of electrical connections needed in the power tool.

Optionally, the human machine interface comprises a microcontroller, and wherein the circuit board comprises an electronic communication bus configured to transfer data between the microcontroller of human machine interface and the microprocessor. Thereby, a power tool is provided having conditions for several features and functions without significantly adding cost and complexity to the power tool.

Optionally, the circuit board comprises a wireless communication unit configured to send and/or receive data to or from an external communication unit. Thereby, a power tool is provided having conditions for several features and functions without significantly adding cost and complexity to the power tool. This because the power tool comprises the circuit board already utilized for the human machine interface and for the sensor arrangement configured to sense the intensity of the magnetic field of the magnet.

Optionally, the circuit board comprises a battery configured to, at least selectively, power the circuit board. Thereby, a more robust and user-friendly power tool is provided because the battery may power the circuit board for example when a main power supply of the power tool is disconnected, turned off, or emptied.

Further features of, and advantages with, the present invention will become apparent when studying the appended claims and the following detailed description.

BRIEF DESCRIPTION OF THE DRAWINGS

Various aspects of the invention, including its particular features and advantages, will be readily understood from the example embodiments discussed in the following detailed description and the accompanying drawings, in which.

DETAILED DESCRIPTION

Aspects of the present invention will now be described more fully. Like numbers refer to like elements throughout.

Well-known functions or constructions will not necessarily be described in detail for brevity and/or clarity.

Figure 1:
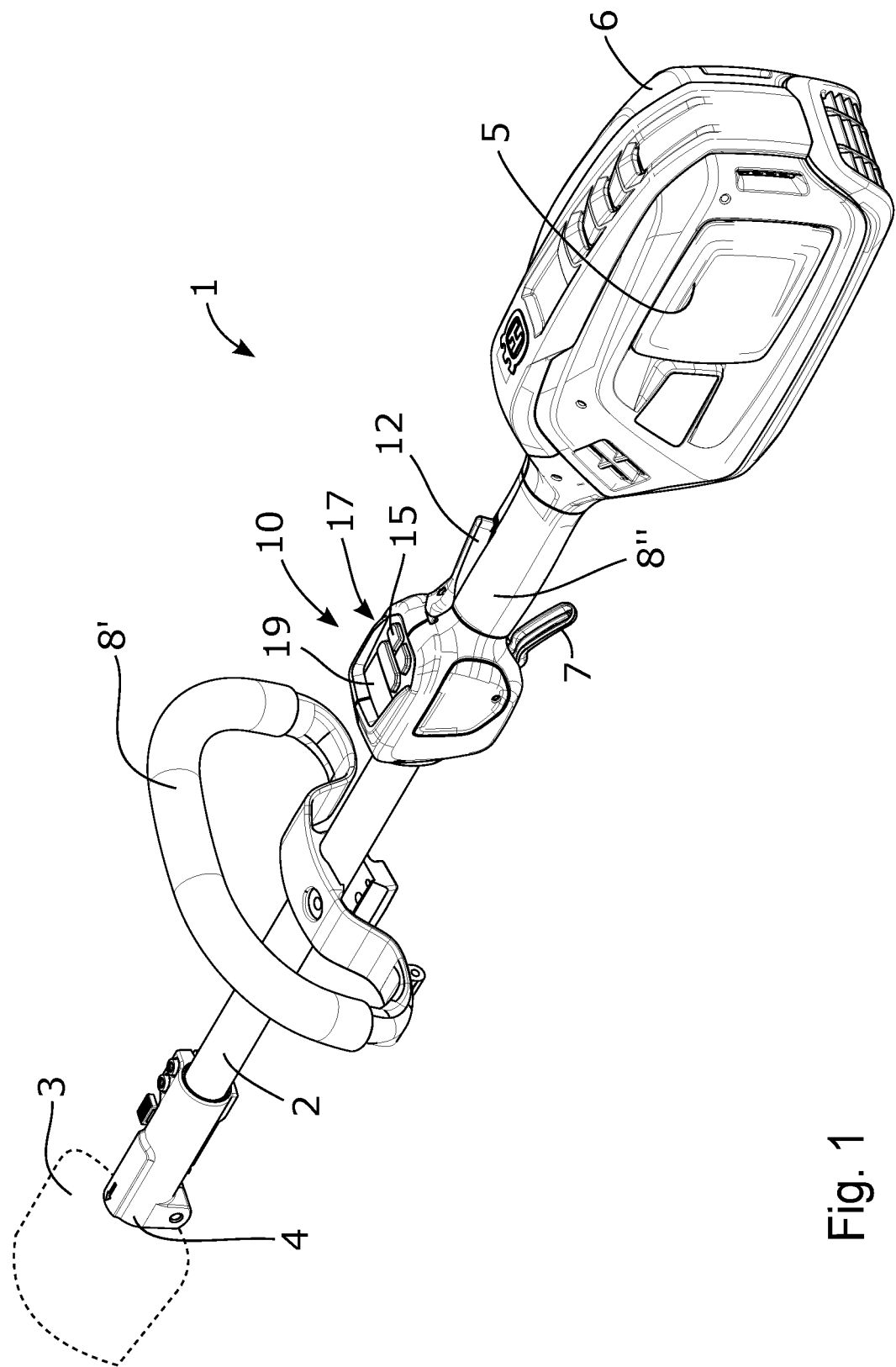
FIG. 1 illustrates a power tool according to some embodiments.

FIG. 1 illustrates a power tool 1, according to some embodiments. According to the illustrated embodiments, the power tool 1 is a handheld power tool in the form of a multi-tool, also referred to as a combi-tool, comprising an elongated body 2 with a connection 4 for a tool 3. The tool 3 is illustrated in dashed lines in FIG. 1. A user may connect a tool 3 such as a trimmer head, a hedge trimmer cutting unit, a chain saw blade, or the like, to the connection 4. The power tool 1 further comprises a power source 5 arranged to power the tool 3. According to the illustrated embodiments, the power tool 1 comprises a shaft extending through the elongated body 2, wherein the shaft is arranged to transmit power from the power source 5 to the tool 3. According to the illustrated embodiments, the power source 5 comprises an electric motor. The power tool 1 comprises a power source casing 6 enclosing the power source 5. Moreover, the power tool 1 comprises a battery arranged in the power source casing 6. The battery is configured to provide electricity to components of the power tool 1, such as the electric motor of the power source 5. According to further embodiments, the power source 5 may comprise another type of power source, such as a combustion engine or pneumatic motor. It is to be understood that the illustrated multi-tool constitutes example embodiments of the invention, which invention is defined only by the appended claims. Thus, according to embodiments herein, the power tool 1 may be another type of power tool than a multi-tool, such as a chain saw, a circular saw, a trimmer, a hedge trimmer, a lawn mower, a leaf blower, a snow blower, or the like.

According to the illustrated embodiments, the power tool 1 comprises a first handle portion 8' arranged to be gripped by one hand of a user and a second handle portion 8" arranged to be gripped by the other hand of the user. The second handle portion 8" comprises a safety switch 12 arranged to be pressed by the palm of the hand of the user. Furthermore, the second handle portion 8" of the power tool 1 comprises a throttle lever 7. According to the illustrated embodiments, the throttle lever 7 is arranged to be pressed by one or more fingers of the user. As is further explained herein, the throttle lever 7 allows a user to control the power outputted by the power source 5. Moreover, the power tool 1 comprises a human machine interface 10, i.e. an interface comprising physical input hardware as well as physical output hardware. According to the illustrated embodiments, the human machine interface 10 comprises a key pad 17 with buttons 15 and a display 19. The human machine interface 10 may be arranged to allow a user to perform settings of the power tool 1, to select operation modes of the power tool 1, to monitor energy status of a battery of the power tool 1, or the like.

According to the illustrated embodiments, the human machine interface 10 is arranged adjacent to the second handle portion 8". Furthermore, according to the illustrated embodiments, the human machine interface 10 is arranged such that the buttons 15 of the human machine interface 10 can be pressed by a finger of the user, for example the thumb of the user, on the hand gripping the second handle portion 8". Thus, according to the illustrated embodiments, the human machine interface 10 and the throttle lever 7 are positioned at positions of the power tool 1 allowing a user to operate the human machine interface 10 and the throttle lever 7 simultaneously using one hand only.

Figure 2:
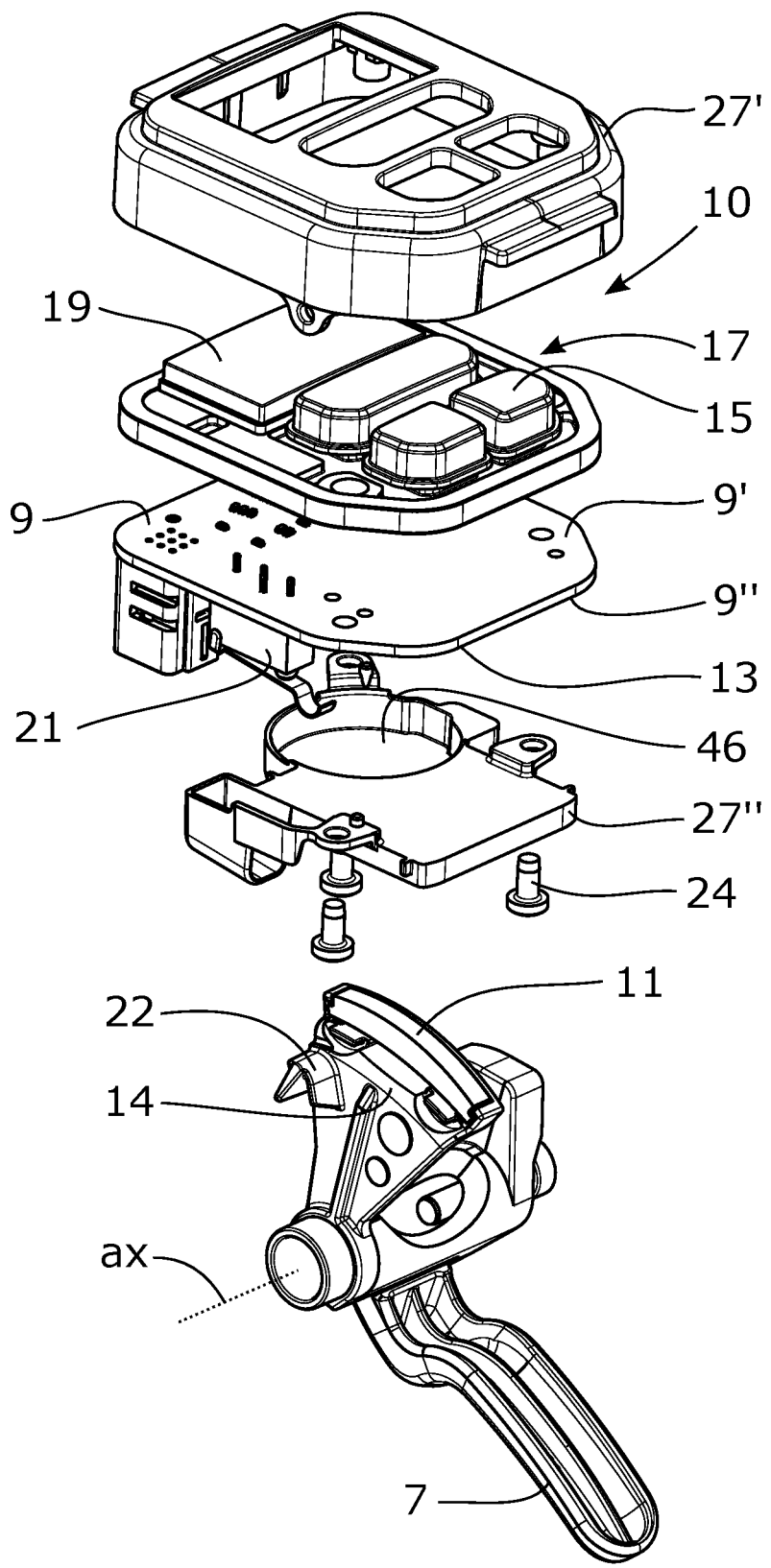
FIG. 2 illustrates an exploded view of components of a human machine interface and a throttle lever of the power tool illustrated in FIG. 1.

FIG. 2 illustrates an exploded view of components of the human machine interface 10 and the throttle lever 7 of the power tool 1 illustrated in FIG. 1. As can be seen in FIG. 2, the power tool 1 comprises a circuit board 9. The circuit board 9 comprises a first side 9' and a second side 9". The second side 9" is opposite to the first side 9'. In an assembled state, the components 15, 17, 19 of the human machine interface 10 are arranged on the first side 9' of the circuit board 9. According to the illustrated embodiments, the throttle lever 7 is pivotally arranged to the power tool around a pivot axis ax. The power tool comprises a magnet 11 operably connected to the throttle lever 7. According to the illustrated embodiments, the magnet 11 is accommodated in a holder 14 at a distance from the pivot axis ax. Furthermore, the magnet 11 is arranged at a distance from the circuit board 9 on the second side 9" of the circuit board 9. The holder 14 is connected to the throttle lever 7. In this manner, a displacement of the throttle lever 7 is transferred to a displacement of the magnet 11 around the pivot axis ax. Thus, according to the illustrated embodiments, the magnet 11 is movably arranged along an arc and is arranged to be moved by a displacement of the throttle lever 7. The throttle lever 7 is displaceable between an unactuated position and an actuated position. In FIG. 2, the throttle lever 7 is illustrated in the unactuated position.

Even though not visible in FIG. 2, the power tool comprises a sensor arrangement 13 arranged on the circuit board 9. According to the illustrated embodiments, the sensor arrangement 13 is arranged on the second side 9" of the circuit board 9. The sensor arrangement 13 is configured to sense the intensity of the magnetic field of the magnet 11. As is further explained herein, several advantages are obtained by the fact that the components 15, 17, 19 of the human machine interface 10 as well as the sensor arrangement 13 are arranged on the circuit board 9. Moreover, as is further explained herein, the sensor arrangement 13 may comprise one or more sensors, such as one, two, or three sensors, configured to sense the intensity of the magnetic field of the magnet 11. However, according to the embodiments illustrated in FIG. 2, the sensor arrangement 13 comprises one sensor only configured to sense the intensity of the magnetic field of the magnet 11.

Furthermore, according to the illustrated embodiments, the power tool comprises a mechanical switch 21 and an actuator 22 operably connected to the throttle lever 7. The actuator 22 is arranged to activate the mechanical switch 21 when the throttle lever 7 is displaced from the unactuated position. The mechanical switch 21 is configured to generate a signal upon activation. In this manner, a displacement of the throttle lever 7 from the unactuated position can be detected in a more reliable manner. As indicated in FIG. 2, the power tool comprises an upper cover 27' and a lower cover 27". In an assembled state, the upper and lower cover 27', 27" forms a sealed enclosure for the circuit board 9. In this manner, the power tool is more resistant to dust, debris, and/or water, in a simple and cost-efficient manner. The lower cover 27" may be attached to the upper cover 27' using one or more fastening elements 24, such as screws, bolts, rivets or snap-in connectors.

Figure 3:
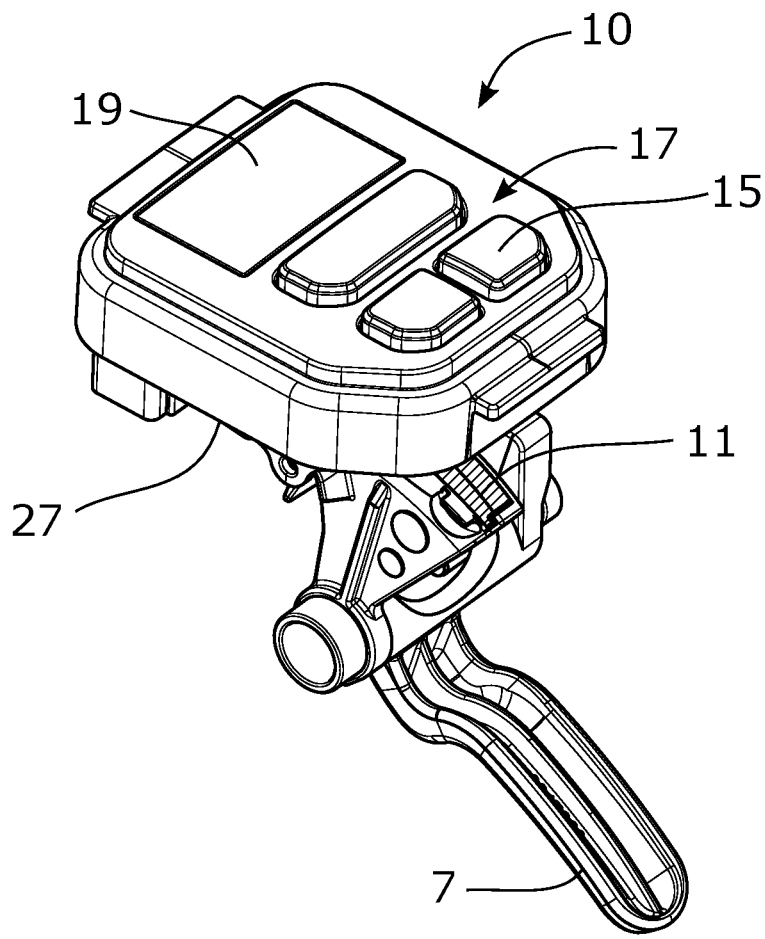
FIG. 3 illustrates the components illustrated in FIG. 2 in the assembled state, FIG. 4 schematically illustrates a side view of a circuit board and a magnet of the embodiments of the power tool illustrated in FIG. 1-FIG. 3, FIG. 5 schematically illustrates a side view of a circuit board and a magnet according to some further embodiments.

FIG. 3 illustrates the components illustrated in FIG. 2 in the assembled state. In FIG. 3, the sealed enclosure 27 is indicated, which thus may constitute the volume formed by the upper cover 27' and lower cover 27" indicated in FIG. 2. Furthermore, as is evident in FIG. 3, according to the illustrated embodiments, the magnet 11 and the throttle lever 7 are each arranged outside of the sealed enclosure 27. In this manner, there is no need for mechanical linkages, or the like, extending through the sealed enclosure 27.

Figure 4:
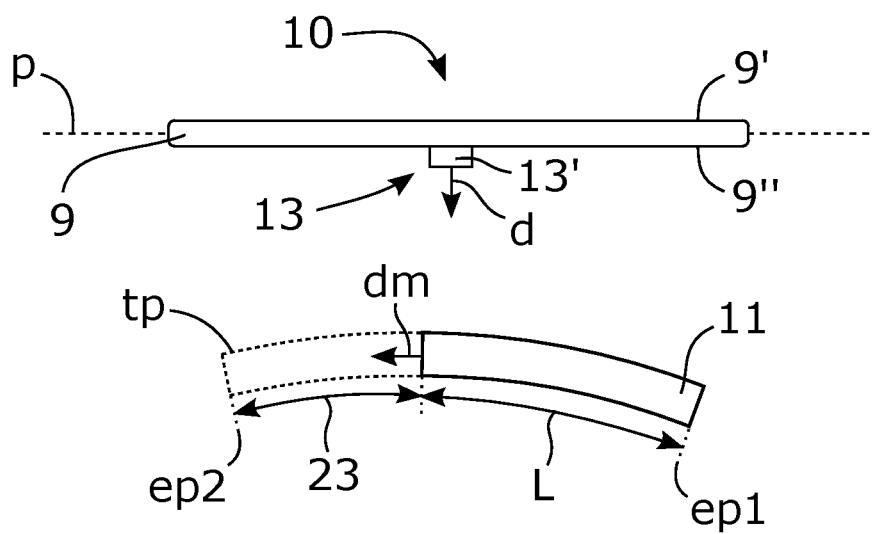

FIG. 4 schematically illustrates a side view of the circuit board 9 and the magnet 11 of the embodiments illustrated in FIG. 2 and FIG. 3. The components of the human machine interface 10 are arranged on the first side 9' of the circuit board 9 and the sensor arrangement 13 is arranged on the second side 9" of the circuit board 9. According to the illustrated embodiments, the sensor arrangement 13 comprises one sensor 13' only configured to sense the intensity of the magnetic field of the magnet 11. The circuit board 9 extends in a plane p. The sensor 13' is configured to sense the intensity of the magnetic field of the magnet 11 along a sensing direction d. According to the illustrated embodiments, the sensing direction d extends through the plane p, and is substantially perpendicular to the plane p. In this manner, a change in the magnetic field of the magnet 11, upon displacement thereof, can be sensed in an accurate and reliable manner, using the sensor 13' of the sensor arrangement 13.

The magnet 11 is movably arranged in a moving direction dm along a travel path tp between a first and a second end point ep1, ep2. According to the illustrated embodiments, the sensing direction d of the sensor 13' crosses the travel path tp of the magnet 11. Furthermore, according to the illustrated embodiments, the magnet 11 comprises an axially magnetized bar. The length L of the magnet 11, in the moving direction dm, may be within the range of 50%-300%, such as within the range of 75%-250%, or within the range of 100%-200%, of a moving distance 23 of the magnet 11 when the magnet 11 moves from the first end point ep1 to the second end point ep2. Due to these features, a change in the magnetic field of the magnet 11, upon displacement thereof, can be sensed in an accurate and reliable manner, using the sensor 13'.

As is further explained herein, according to some embodiments of the present disclosure, the sensor arrangement 13 may comprise more than one sensor 13' configured to sense the intensity of the magnetic field of the magnet 11. According to some embodiments, the magnet 11 and the sensor arrangement 13 are arranged such that the magnetic field of the magnet 11, at the position of the sensor arrangement 13 and in at least one sensing direction d of the sensor arrangement 13, changes polarity upon a displacement of the throttle lever from the unactuated position towards the actuated position. Thereby, an even more accurate, robust, and reliable sensing of the position of magnet 11 is provided. This because the change in polarity of the magnetic field of the magnet 11 can be sensed in a more accurate manner than a change in field strength of the magnetic field of the magnet 11. The change in polarity, as referred to herein, may also be referred to as a zero-transition.

According to the embodiments illustrated in FIG. 4, the magnet 11 is operably connected to the throttle lever 7 such that the magnet 11 assumes a position at the first end point ep1 when the throttle lever is in the unactuated position and assumes a position at the second end point ep2 when the throttle lever is in a fully actuated position. According to some embodiments of the present disclosure, the magnet 11 and the sensor arrangement 13 are arranged such that the magnetic field of the magnet 11, at the position of the sensor arrangement 13 and in at least one sensing direction d of the sensor arrangement 13, changes polarity when the throttle lever 7 is displaced a distance within the range of 5%-20% of a full travel length of the throttle lever 7 between the unactuated position and the actuated position. Thereby, an even more accurate, robust, and reliable sensing of a displacement of the magnet 11 from the first end point ep1 is provided. This because the change in polarity of the magnetic field of the magnet 11 can be sensed in a more accurate manner than a change in field strength of the magnetic field of the magnet 11.

Figure 5:
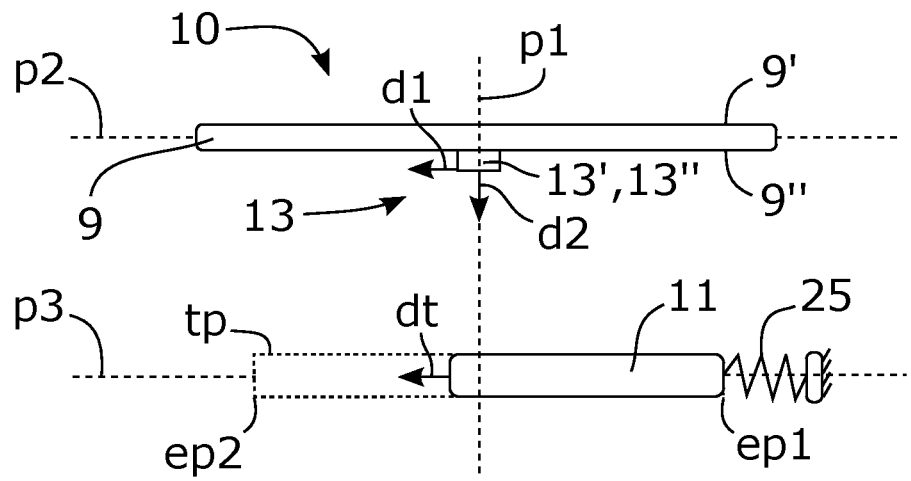

FIG. 5 schematically illustrates a side view of a circuit board 9 and a magnet 11 according to some further embodiments. The arrangement illustrated in FIG. 5 comprises the same features, functions, and advantages as those described above, with some differences explained below. According to the embodiments illustrated in FIG. 5, the sensor arrangement 13 of the circuit board 9 comprises two sensors 13', 13", i.e. a first sensor 13' and a second sensor 13", each configured to sense the intensity of the magnetic field of the magnet 11 along a respective sensing direction d1, d2. That is, according to the illustrated embodiments, the sensor arrangement 13 is configured to sense the intensity of the magnetic field of the magnet 11 along a first sensing direction d1 and along a second sensing direction d2, wherein the second sensing direction d2 is different from the first sensing direction d1.

Furthermore, according to the illustrated embodiments, the magnet 11 is movably arranged along a substantially linear travel path tp between a first and a second end point ep1, ep2. The power tool comprises a spring 25 arranged to bias the magnet 11 towards the first endpoint ep1.

The sensors 13', 13" of the sensor arrangement are arranged in a first plane p1, the circuit board 9 extends in a second plane p2 and the magnet 11 is movably arranged in a third plane p3. The third plane p3 is substantially parallel to the second plane p2. The first plane p1 is substantially perpendicular to the travel path tp and is thus substantially perpendicular to the second and third planes p2, p3. The first sensing direction d1 extends in a direction substantially coinciding with a direction dt of a travel path tp of the magnet 11. Thus, according to the illustrated embodiments, the first sensing direction d1 is substantially parallel to the second and third planes p2, p3. The second sensing direction d2 extends through the second and third planes p2, p3 and is substantially perpendicular to the second and third planes p2, p3.

Due to these features, a more robust and reliable sensing of the position of the magnet 11 is provided. This because by utilizing measurements of the magnetic field of the magnet 11 in two different sensing directions d1, d2, the combined measurements will indicate the angle of the magnetic field instead of solely the strength of the magnetic field, which will vary less and be less sensitive to disturbances than when only utilizing a measurement of the strength of the magnetic field of the magnet 11.

The wording "substantially parallel to" may herein be defined as that the angle between the objects referred to is less than 5 degrees. The wording "substantially perpendicular to" may herein be defined as that the angle between the objects referred to is within the range of 85 degrees to 95 degrees.

Figure 6:
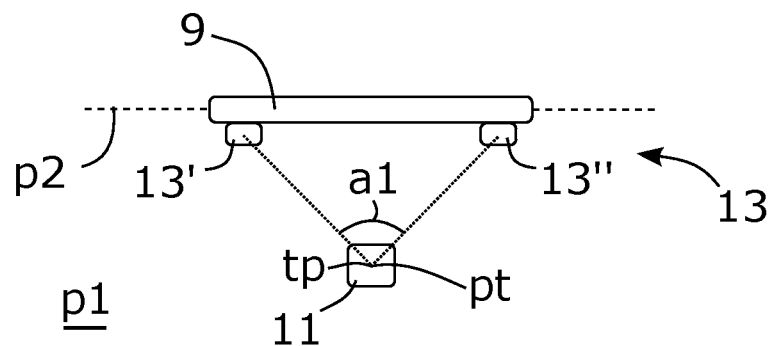
FIG. 6 illustrates a cross section of the circuit board and the magnet according to the embodiments illustrated in FIG. 5, FIG. 7 schematically illustrates a side view of a circuit board and a magnet according to some further embodiments, FIG. 8 schematically illustrates a cross section of a circuit board and a magnet according to some further embodiments, and FIG. 9 schematically illustrates the circuit board, a power source, and a power source controller of the power tool, illustrated in FIG. 1.

FIG. 6 illustrates a cross section of the circuit board 9 and the magnet 11 according to the embodiments illustrated in FIG. 5. In FIG. 6, the cross section is made in the first plane p1. As indicated in FIG. 6, according to the illustrated embodiments, the angle a1 between the sensors 13', 13" of the sensor arrangement 13, measured in the first plane p1 at a point pt coinciding with the travel path tp of the magnet 11, is approximately 90 degrees. According to further embodiments, the angle a1 between the sensors 13', 13" of the sensor arrangement 13, measured in the first plane p1 at a point pt coinciding with the travel path tp of the magnet 11, is approximately 180 degrees. According to such embodiments, as well as according to other embodiments explained herein, the sensors 13', 13" of the sensor arrangement 13 may be arranged at a greater distance from the circuit board than depicted in FIG. 5 and FIG. 6.

According to further embodiments, the sensing directions d1, d2 of the first and second sensors 13', 13" of the embodiments illustrated in FIG. 5 and FIG. 6 may be other than depicted in FIG. 5. For example, the first and second sensors 13', 13" may each comprise a sensing direction d1, d2 substantially parallel to the second plane p2. As a further example, the first and second sensors 13', 13" may each comprise a sensing direction d1, d2 which crosses the second plane p2, such as a sensing direction d1, d2 substantially perpendicular to the second plane p2.

As is further explained with reference to FIG. 8 below, the three sensors 13', 13", 13''' may each be utilized to detect a displacement of the throttle lever from an unactuated position. According to such embodiments, the three sensors 13', 13", 13''' may each be arranged to generate a discrete signal when the throttle lever is displaced from the unactuated position. The magnet 11 and the sensor arrangement 13 may be arranged such that the magnetic field of the magnet 11, at the position of the three sensors 13', 13", 13''', changes polarity when the throttle lever is displaced a distance from the unactuated position. By utilizing three sensors 13', 13", 13''' for detecting a displacement of the throttle lever from the unactuated position, an even more accurate, robust, and reliable sensing is provided of a displacement of the throttle lever from the unactuated position. Moreover, according to these embodiments, the sensor arrangement 13 may comprise one or more further sensors configured to sense the intensity of the magnetic field, wherein the control of the power of the power source is based on data from the one or more further sensors.

The wording "approximately 90 degrees" may herein be defined as an angle within the range of 85 degrees and 95 degrees. The wording "approximately 180 degrees" may herein be defined as an angle within the range of 175 degrees and 185 degrees.

Figure 7:
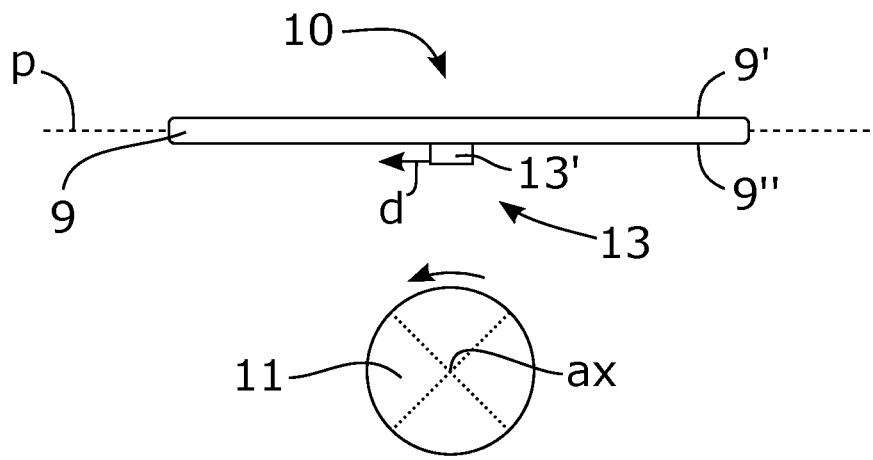

FIG. 7 schematically illustrates a side view of a circuit board 9 and a magnet 11 according to some further embodiments. The arrangement illustrated in FIG. 7 comprises the same features, functions, and advantages as those described above, with some differences explained below. According to the embodiments illustrated in FIG. 7, the magnet 11 is shaped as a wheel and is rotatably arranged around an axis ax. The axis ax is substantially parallel to the plane p in which the circuit board 9 extends. Accordingly, the rotational plane of the magnet 11 is substantially perpendicular to the plane p in which the circuit board 9 extends. The magnet 11 is arranged such that magnetic field of the magnet varies in the rotational plane of the magnet 11. The magnet 11 is operably connected to the throttle lever of the power tool such that a displacement of the throttle is transferred to a rotation of the magnet 11. According to the illustrated embodiments, the sensor arrangement 13 comprises one sensor 13' only configured to sense the magnetic field of the magnet 11 in a sensing direction d substantially parallel to the plane p in which the circuit board 9 extends. However, also in these embodiments, the sensor arrangement 13 may comprise two or more sensors each configured to sense the magnetic field of the magnet 11.

Figure 8:
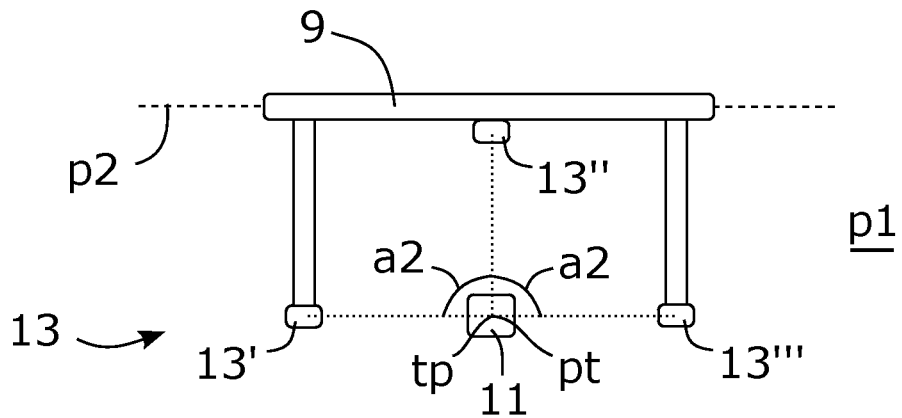

FIG. 8 schematically illustrates a cross section of a circuit board 9 and a magnet 11 according to some further embodiments. According to the embodiments illustrated in FIG. 8, the sensor arrangement 13 comprises three sensors 13', 13", 13'''. The sensors 13', 13", 13''' are arranged in a first plane p1 substantially perpendicular to a second plane p2 in which the circuit board 9 extends. The cross section of FIG. 8 is made through the first plane p1. The first plane p1 is perpendicular to the travel path tp of the magnet 11. As indicated in FIG. 8, according to the illustrated embodiments, the angle a2 between two adjacent sensors 13', 13", 13''' of the three sensors 13', 13", 13''', measured in the first plane p1 at a point pt coinciding with the travel path tp of the magnet 11, is approximately 90 degrees. According to further embodiments, the angle a2 between two adjacent sensors 13', 13", 13''' of the three sensors 13', 13", 13''', measured in the first plane p1 at a point pt coinciding with the travel path tp of the magnet 11, is approximately 120 degrees. Due to these features, a sensor arrangement 13 is provided being less sensitive to external disturbances. The wording "approximately 120 degrees" may herein be defined as an angle within the range of 115 degrees and 125 degrees.

According to some embodiments, the three sensors 13', 13", 13''' may each comprise a separate sensing direction. Furthermore, the three sensors 13', 13", 13''' may each comprise a sensing direction substantially parallel to the second plane p2. As an alternative, the three sensors 13', 13", 13''' may each comprise a sensing direction which crosses the second plane p2, such as a sensing direction substantially perpendicular to the second plane p2.

As is further explained with reference to FIG. 9 below, the three sensors 13', 13", 13''' may each be utilized to detect a displacement of the throttle lever from an unactuated position. According to such embodiments, the three sensors 13', 13", 13''' may each be arranged to generate a discrete signal when the throttle lever is displaced from the unactuated position. The magnet 11 and the sensor arrangement 13 may be arranged such that the magnetic field of the magnet 11, at the position of the three sensors 13', 13", 13''', changes polarity when the throttle lever is displaced a distance from the unactuated position. By utilizing three sensors 13', 13", 13''' for detecting a displacement of the throttle lever from the unactuated position, an even more accurate, robust, and reliable sensing is provided of a displacement of the throttle lever from the unactuated position. Moreover, according to these embodiments, the sensor arrangement 13 may comprise one or more further sensors configured to sense the intensity of the magnetic field, wherein the control of the power of the power source is based on data from the one or more further sensors.

Figure 9:
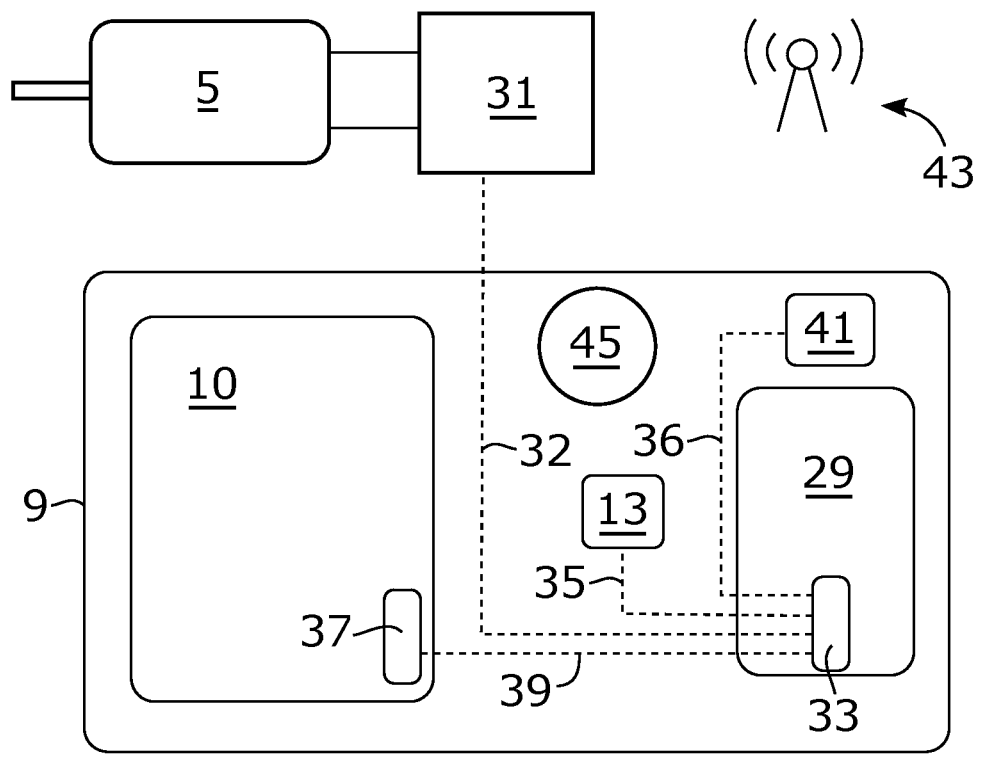

FIG. 9 schematically illustrates the circuit board 9, the power source 5, and a power source controller 31 of the power tool 1, illustrated in FIG. 1. Below, simultaneous reference is made to FIG. 1, FIG. 2, FIG. 4, and FIG. 9. As indicated in FIG. 9, the power tool 1 comprises a control unit 29 arranged on the circuit board 9. The control unit 29 is configured to monitor the position of the throttle lever 7 based on data from the sensor arrangement 13. The control unit 29 is operably connected to the one or more sensors 13', 13", 13''' of the sensor arrangement 13 and is configured to, based on data from the one or more sensors 13', 13", 13''' of the sensor arrangement 13, monitor the position of the throttle lever 7.

According to the illustrated embodiments, the control unit 29 comprises a microprocessor 33. Thus, according to the illustrated embodiments, the circuit board 9 is a microprocessor-based circuit board. Moreover, the circuit board 9 comprises an electronic communication bus 35 configured to transfer data between the sensor arrangement 13 and the microprocessor 33. That is, according to the illustrated embodiments, the control unit 29 is operably connected to the sensor arrangement 13 via the electronic communication bus 35. According to these embodiments, the sensor arrangement 13 may comprise a microcontroller.

Furthermore, the control unit 29 is operably connected to the power source controller 31. The control unit 29 is configured to output a signal representative of the monitored position of the throttle lever 7 to the power source controller 31. The power source controller 31 is configured to control the power of the power source 5 in dependence of the monitored position of the throttle lever 7. According to the illustrated embodiments, the power tool 1 comprises an electronic communication bus 32 configured to transfer data between the control unit 29 and the power source controller 31. The control unit 29 is thus operably connected to the power source controller 31 via the electronic communication bus 32.

Moreover, according to the illustrated embodiments, the microprocessor 33 of the control unit 29 is operably connected to the human machine interface 10. The human machine interface comprises a microcontroller 37, and the circuit board 9 comprises an electronic communication bus 39 configured to transfer data between the microcontroller 37 of human machine interface 10 and the microprocessor 33 of the control unit 29. The microprocessor 33 of the control unit 29 is thus operably connected to the human machine interface 10 via the electronic communication bus 39.

Furthermore, according to the illustrated embodiments, the circuit board 9 comprises a wireless communication unit 41 configured to send and/or receive data to or from an external communication unit 43. According to the illustrated embodiments, the microprocessor 33 of the control unit 29 is operably connected to the wireless communication unit 41 via a electronic communication bus 36. The wireless communication unit 41 is thus configured to wirelessly transmit data to, and/or receive data from, the external communication unit 43. The wireless communication may for example be performed over a wireless connection such as the internet, or a wireless local area network (WLAN), or a wireless connection for exchanging data over short distances using short-wavelength, i.e. ultra-high frequency (UHF) radio waves in the industrial, scientific and medical (ISM) band from 2.4 to 2.485 GHz, e.g. Bluetooth. The external communication unit 43 may for example be a wireless network router, for example a Wi-Fi router, or a cell phone.

One or more of the electronic communication buses 32, 35, 36, 39 referred to above, and depicted in FIG. 9, may be comprised in one electronic communication bus, or one communication bus system. Moreover, for the reason of brevity and clarity, the components of the circuit board 9 are depicted on the same side of the circuit board 9 in FIG. 9. However, some components of the circuit board 9 may be arranged on opposite sides of the circuit board 9, such as the sensor arrangement 13 and the human machine interface 10.

By using one or more electronic communication buses 32, 35, 36, 39, the number of cables is significantly reduced, and some advanced functions can be implemented to the power tool 1 without significantly adding cost and complexity to the power tool 1. Moreover, the reduction of the number of cables provides a more robust and reliable power tool 1. In addition, the control unit 29 may be operably connected to one or more further systems and components than depicted in FIG. 9. As an example, the control unit 29 may be operably connected to one or more auxiliary buttons, actuators, safety switches 12, or the like.

As is further explained herein, according to some embodiments of the present disclosure, the sensor arrangement 13 comprises at least two sensors 13', 13". According to such embodiments, the control unit 29 may be configured to detect a displacement of the throttle lever 7 from an unactuated position using data from the at least two sensors 13', 13".

Thereby, an even more accurate, robust, and reliable sensing is provided of a displacement of the throttle lever 7 from the unactuated position. As a further result, a safer power tool 1 can be provided in a cost-efficient manner.

According to the embodiments illustrated in FIG. 9, the circuit board 9 comprises a battery 45 configured to, at least selectively, power the circuit board 9. The battery 45 may for example power the circuit board 9 when a main power supply of the power tool 1 is disconnected, turned off, or emptied. A holder 46 for the battery 45 is indicated in FIG. 2.

The one or more sensors 13', 13", 13" of the sensor arrangement 13, as referred to herein, may each comprise a Hall-effect sensor, a giant magnetoresistance sensor, or the like. A giant magnetoresistance sensor is sometimes referred to as a GMR sensor.

As indicated above, according to embodiments of the present disclosure, the power tool 1 may be a blower such as a debris blower, a leaf blower, a snow blower, or the like. According such embodiments, the tool 3, as referred to herein, may comprise a fan and a fan casing.

The magnet 11, as referred to herein, may comprise an axially magnetized bar or rod. Furthermore, the magnet 11, as referred to herein, may comprise a rare-earth magnet, such as a neodymium magnet, also known as NdFeB, NIB or Neo magnet, made from an alloy of neodymium, iron and boron, or a samarium-cobalt magnet, also known as SmCo magnet, made of an alloy of samarium and cobalt. Moreover, according to some embodiments, the magnet 11 may comprise plastic bonded magnet powder, such as rare-earth magnet powder.

The control unit 29 may comprise a calculation unit which may take the form of substantially any suitable type of processor circuit or microcomputer, e.g. a circuit for digital signal processing (digital signal processor, DSP), a Central Processing Unit (CPU), a processing unit, a processing circuit, a processor, an Application Specific Integrated Circuit (ASIC), a microprocessor, or other processing logic that may interpret and execute instructions. The herein utilised expression "calculation unit" may represent a processing circuitry comprising a plurality of processing circuits, such as, e.g., any, some or all the ones mentioned above.

The control unit 29 may further comprise a memory unit, wherein the calculation unit may be connected to the memory unit, which may provide the calculation unit with, for example, stored program code and/or stored data which the calculation unit may need to enable it to do calculations. The calculation unit may also be adapted to store partial or final results of calculations in the memory unit. The memory unit may comprise a physical device utilised to store data or programs, i.e., sequences of instructions, on a temporary or permanent basis. According to some embodiments, the memory unit may comprise integrated circuits comprising silicon-based transistors. The memory unit may comprise e.g. a memory card, a flash memory, a USB memory, a hard disc, or another similar volatile or non-volatile storage unit for storing data such as e.g. ROM (Read-Only Memory), PROM (Programmable Read-Only Memory), EPROM (Erasable PROM), EEPROM (Electrically Erasable PROM), etc. in different embodiments.

The control unit 29 is connected to components of the power tool 1 for receiving and/or sending input and output signals. These input and output signals may comprise waveforms, pulses, or other attributes which the input signal receiving devices can detect as information and which can be converted to signals processable by the control unit 29. These signals may then be supplied to the calculation unit. One or more output signal sending devices may be arranged to convert calculation results from the calculation unit to output signals for conveying to other parts of the control system of the power tool 1 and/or the component or components for which the signals are intended. Each of the connections to the respective components of the power tool 1 for receiving and sending input and output signals may take the form of one or more from among a cable, an electronic communication bus, or a wireless connection.

In the embodiments illustrated, the power tool 1 comprises a control unit 29 but might alternatively be implemented wholly or partly in two or more control arrangements or two or more control units.

As is further explained herein, different electronic units of the power tool 1 may be connected to each other via one or more electronic communication buses 32, 35, 36, 39. The different electronic units accordingly, may communicate with each other via the one or more electronic communication buses 32, 35, 36, 39. The one or more electronic communication buses 32, 35, 36, 39 may have a bus architecture such as a CAN (Controller Area Network) bus. The different electronic units may include a number of ECUs (Electronic Control Unit), or nodes, which are connected to the one or more electronic communication buses 32, 35, 36, 39. Each ECU may be configured for controlling one subsystem, or a limited number of related subsystems, of the power tool 1. Each ECU may be configured to calculate data. Accordingly, data calculated by one ECU may be accessible to all other ECUs connected to the electronic communication bus 32, 35, 36, 39.

It is to be understood that the foregoing is illustrative of various example embodiments and that the invention is defined only by the appended claims. A person skilled in the art will realize that the example embodiments may be modified, and that different features of the example embodiments may be combined to create embodiments other than those described herein, without departing from the scope of the present invention, as defined by the appended claims.

As used herein, the term "comprising" or "comprises" is open-ended, and includes one or more stated features, elements, steps, components or functions but does not preclude the presence or addition of one or more other features, elements, steps, components, functions or groups thereof.

The invention claimed is:

1. A power tool comprising:
a tool implement,
an elongated body defining a longitudinal axis,
a first handle portion attached to the elongated body at a first position along the longitudinal axis,
a power source arranged to power the tool implement,
a second handle portion attached to the elongated body at a second position along the longitudinal axis and comprising a throttle lever, wherein the first position is closer to the tool implement along the longitudinal axis than the second position,
a circuit board located in a sealed enclosure,
a human machine interface comprising components arranged on and adjacent a first side of the circuit board,
a magnet operably connected to the throttle lever, wherein the magnet is moveably arranged along an arc in response to a displacement of the throttle lever, and
a sensor arrangement configured to sense an intensity of a magnetic field of the magnet, wherein the sensor arrangement is arranged on and adjacent a second side of the circuit board, wherein the sensor arrangement comprises at least two sensors each configured to sense the intensity of the magnetic field of the magnet along a different sensing direction,
wherein the magnet is located outside of the sealed enclosure.

2. The power tool according to claim 1, wherein the magnet is arranged at a distance from the circuit board on the second side of the circuit board.

3. The power tool according to claim 1, wherein the sensor arrangement senses the intensity of the magnetic field of the magnet along a first sensing direction and along a second sensing direction, and wherein the second sensing direction is different from the first sensing direction, wherein the sensor arrangement is arranged in a first plane, and the first sensing direction extends in a direction substantially coinciding with a direction of a travel path of the magnet, and wherein the circuit board extends in a second plane, and wherein the second sensing direction extends through the second plane.

4. The power tool according to claim 1, wherein the components of the human machine interface comprise one or more buttons, a key pad, or a display.

5. The power tool according to claim 1, wherein the throttle lever is displaceable between an unactuated position and an actuated position, and wherein the power tool comprises a mechanical switch configured to generate a signal when the throttle lever is displaced from the unactuated position.

6. The power tool according to claim 1, wherein the throttle lever is displaceable between an unactuated position and an actuated position, and wherein the magnet and the sensor arrangement are arranged such that the magnetic field of the magnet, at the position of the sensor arrangement and in at least one sensing direction of the sensor arrangement, changes an angle of the magnetic field of the magnet upon a displacement of the throttle lever from the unactuated position towards the actuated position.

7. The power tool according to claim 6, wherein the actuated position is a fully actuated position, and wherein the magnet and the sensor arrangement are arranged such that the magnetic field of the magnet, at the position of the sensor arrangement and in at least one sensing direction of the sensor arrangement, changes an angle of the magnetic field of the magnet when the throttle lever is displaced a distance within the range of 5%-20% of a full travel length of the throttle lever between the unactuated position and the actuated position.

8. The power tool according to claim 1, wherein the magnet is movably arranged in a moving direction between a first and a second end point, and wherein the length of the magnet, in the moving direction, is within the range of 50%-300% of a moving distance of the magnet between the first and second end points.

9. The power tool according to claim 1, wherein the circuit board extends in a second plane and the magnet is movably arranged in a third plane, and wherein the third plane is substantially parallel to the second plane, and wherein the magnet is movably arranged along the arc.

10. The power tool according to claim 1, wherein the magnet is movably arranged between a first and a second end point, and wherein the power tool comprises a spring arranged to bias the magnet towards the first endpoint.

11. The power tool according to claim 1, wherein the sensor arrangement comprises at least two sensors each configured to sense the intensity of the magnetic field of the magnet, and
wherein the magnet is movably arranged along a travel path, and wherein the at least two sensors are arranged in a first plane substantially perpendicular to the travel path.

12. The power tool according to claim 11, wherein the angle between two sensors of the at least two sensors, measured in the first plane at a point coinciding with the travel path of the magnet, is approximately 90 degrees, or
wherein the sensor arrangement comprises three sensors, and wherein the angle between two adjacent sensors of the three sensors, measured in the first plane at the point coinciding with the travel path of the magnet, is approximately 90 degrees or approximately 120 degrees.

13. The power tool according to claim 1, wherein the power tool comprises a control unit configured to monitor the position of the throttle lever based on data from the sensor arrangement.

14. The power tool according to claim 13, wherein the control unit is arranged on the circuit board, and
wherein the sensor arrangement comprises at least two sensors, and wherein the control unit is configured to detect a displacement of the throttle lever from an unactuated position using data from the at least two sensors.

15. The power tool according to claim 13, wherein the power tool comprises a power source controller, wherein the control unit is operably connected to the power source controller, and wherein the power source controller is configured to control the power of the power source in dependence of the monitored position of the throttle lever.

16. The power tool according to claim 15, wherein the power tool comprises an electronic communication bus, wherein the control unit is operably connected to the power source controller via the electronic communication bus, and
wherein the control unit comprises a microprocessor that is operably connected to the human machine interface.

17. The power tool according to claim 13, wherein the circuit board comprises a first electronic communication bus configured to transfer data between the sensor arrangement and a microprocessor, and
wherein the human machine interface comprises a microcontroller, and wherein the circuit board comprises a second electronic communication bus configured to transfer data between the microcontroller of human machine interface and the microprocessor.

18. The power tool according to claim 1, wherein the circuit board comprises a wireless communication unit configured to send and/or receive data to or from an external communication unit, and
wherein the circuit board comprises a battery configured to, at least selectively, power the circuit board.

19. A power tool comprising:
a tool attachment,
an elongated body,
a first handle portion attached to the elongated body,
a power source arranged to power the tool,
a second handle portion attached to the elongated body and comprising a throttle lever,
a circuit board located in a sealed enclosure,
a human machine interface comprising components arranged on and adjacent a first side of the circuit board,
a magnet operably connected to the throttle lever, wherein the magnet is moveably arranged along an arc in response to a displacement of the throttle lever, and
a sensor arrangement configured to sense an intensity of a magnetic field of the magnet, wherein the sensor arrangement is arranged on and adjacent a second side of the circuit board,
wherein the magnet is located outside of the sealed enclosure and movably arranged along a travel path,
wherein the sensor arrangement comprises at least two sensors each configured to sense the intensity of the magnetic field of the magnet, wherein the at least two sensors are arranged in a first plane substantially perpendicular to the travel path, and wherein an angle between two adjacent sensors of the at least two sensors, measured in the first plane at a point coinciding with the travel path of the magnet, is approximately 90 degrees or 120 degrees.

* * * * *